(12) United States Patent
McFarland et al.

(10) Patent No.: US 7,867,366 B1
(45) Date of Patent: Jan. 11, 2011

(54) COAXIAL PLASMA ARC VAPOR DEPOSITION APPARATUS AND METHOD

(75) Inventors: Michael D. McFarland, Oakland, CA (US); Mahadevan Krishnan, Oakland, CA (US); Jason D. Wright, San Mateo, CA (US); Andrew N. Gerhan, Oakland, CA (US); Benjamin Tang, San Francisco, CA (US)

(73) Assignee: Alameda Applied Sciences Corp., San Leandro, CA (US)

( * ) Notice: Subject to any disclaimer, the term of this patent is extended or adjusted under 35 U.S.C. 154(b) by 1171 days.

(21) Appl. No.: 10/834,592

(22) Filed: Apr. 28, 2004

(51) Int. Cl.
*C23C 14/00* (2006.01)
*C23C 14/32* (2006.01)

(52) U.S. Cl. .............. 204/192.38; 204/298.41

(58) Field of Classification Search ............ 204/192.38, 204/290.01, 298.41; 427/561
See application file for complete search history.

(56) References Cited

U.S. PATENT DOCUMENTS

| | | | |
|---|---|---|---|
| 2,972,695 A | 2/1961 | Wroe | |
| 3,625,848 A | 12/1971 | Snaper | |
| 3,627,590 A * | 12/1971 | Mammel | 438/550 |
| 3,783,231 A | 1/1974 | Sablev et al. | |
| 4,407,712 A * | 10/1983 | Henshaw et al. | 204/298.05 |
| 4,407,713 A * | 10/1983 | Zega | 204/298.22 |
| 4,492,845 A | 1/1985 | Kljuchko | |
| 4,609,564 A | 9/1986 | Pinkhasov | |
| 4,724,058 A | 2/1988 | Morrison, Jr. | |
| 4,849,088 A | 7/1989 | Veltrop et al. | |
| 4,859,489 A | 8/1989 | Pinkasov | |
| 5,026,466 A * | 6/1991 | Wesemeyer et al. | 204/192.38 |
| 5,037,522 A | 8/1991 | Vergason | |
| 5,269,898 A | 12/1993 | Welty | |
| 5,277,714 A * | 1/1994 | Tamagaki | 204/192.38 |
| 5,306,408 A | 4/1994 | Treglio | |
| 5,354,963 A | 10/1994 | Muller et al. | |
| 5,744,017 A * | 4/1998 | Tamagaki et al. | 204/298.41 |

(Continued)

FOREIGN PATENT DOCUMENTS

JP 58207680 A * 12/1983

OTHER PUBLICATIONS http://www.tokenonline.net/pdf/hv-resistor.pdf [Accessed on Aug. 24, 2007].*

(Continued)

*Primary Examiner*—Alexa D Neckel
*Assistant Examiner*—Michael Band
(74) *Attorney, Agent, or Firm*—File-EE-Patents.com; Jay A. Chesavage

(57) ABSTRACT

An apparatus for the deposition of a variable thickness coating onto the inside of a cylindrical tube comprises a variable pressure gas, an cathode coaxially positioned within the cylinder, and a voltage source applied between the cathode and cylindrical tube, which functions as an anode. A radial plasma arc is generated between the anode and cathode at a starting point on the cylinder, and the plasma arc travels down the central axis of the cylinder, providing a helical deposition region on the inside of the cylinder. Selection of the combination of cathode material and gas enable the plasma to generate ionic material which is deposited on the anodic cylinder in the region of the plasma. By varying the pressure of variable pressure gas for each helical path, it is possible to vary the composition of this deposition film.

22 Claims, 4 Drawing Sheets

U.S. PATENT DOCUMENTS

| | | | |
|---|---|---|---|
| 5,908,602 A | 6/1999 | Bardos et al. | |
| 5,976,636 A | 11/1999 | Leu et al. | |
| 6,103,074 A * | 8/2000 | Khominich | 204/192.38 |
| 6,193,853 B1 * | 2/2001 | Yumshtyk et al. | 204/192.12 |
| 6,346,301 B2 * | 2/2002 | Beele et al. | 427/561 |
| 6,811,660 B2 * | 11/2004 | Maekawa | 204/290.01 |
| 6,866,752 B2 * | 3/2005 | Schramm | 204/192.38 |
| 2004/0134770 A1 * | 7/2004 | Petersen | 204/192.38 |

OTHER PUBLICATIONS

Cathode definition (http://www.merriam-webster.com/dictionary/cathode) [Accessed on Nov. 17, 2008].*

Anode Definition (http://www.merriam-webster.com/dictionary/anode) [Accessed on Nov. 17, 2008].*

Titanium Nitride properties (http://www.memsnet.org/material/titaniumnitridetinbulk/) [Accessed on Nov. 18, 2008].*

* cited by examiner

Perspective view

Section b-b view

COAXIAL PLASMA ARC VAPOR DEPOSITION APPARATUS AND METHOD

FIELD OF THE INVENTION

The invention pertains to the use of a rotating plasma for the deposition of ceramic and metal materials onto a conductive cylindrical surface. In particular, the composition of the deposition over the inner surface of a cylinder may be controlled such that the composition of the coating may be varied through the thickness of the coating.

BACKGROUND OF THE INVENTION

This invention relates generally to the coating of substrates using vacuum arc evaporation, and more particularly to an improved method and apparatus that employs a cylindrical metallic cathode and a magnetic field interacting with a plasma arc to cause the plasma arc to follow a helical trajectory on the surface of the cylindrical cathode.

Vacuum arc evaporation can be used for deposition of metal, alloy, and metal compound coatings. A cathode composed of the material to be deposited is vaporized by a high current, low voltage arc plasma discharge in a vacuum chamber, which has been evacuated to a pressure of typically $10^{-4}$ Torr or less. The substrates to be coated are placed in the vacuum chamber facing the evaporable surface of the cathode, at a distance of typically 10-50 cm. Typical arc currents range between 25 and 500 amperes, with voltages between 15 and 50 volts. The arc discharge occurs between an anode terminal and a cathode terminal in the partially evacuated chamber, resulting in a metal vapor plasma created by vaporization and ionization of the cathode material by the arc. The cathode, or negative electrode, is an electrically isolated structure which is at least partially consumed during the process. The anode, or positive electrode, comprises a cylinder disposed around the cathode. An arc is initiated on the evaporable surface of the cathode by means of mechanical contact, high voltage spark, or laser irradiation. The ensuing arc plasma discharge is highly localized in one or more mobile arc spots on the cathode surface, but is distributed over a large area at the anode. The extremely high current density in the arc spot, estimated to be $10^{10}$-$10^{12}$ amperes/m$^2$, results in local heating, evaporation, and ionization of the cathode material. Each arc spot emits a jet of metal vapor plasma in a direction approximately perpendicular to the cathode surface, forming a luminous plume extending into the region between the cathode and anode, where the substrates to be coated are disposed. The metal vapor condenses on the substrate surface, forming a dense coating. Reactive gases may be introduced into the vacuum chamber during the evaporation process, resulting in the formation of metal compound coatings on the substrate surface.

When the arc current is below 70-100 amperes, depending on the material, only a single arc spot will exist. At higher arc currents, multiple arc spots exist simultaneously, each carrying an equal fraction of the total arc current. An arc spot, in the absence of applied magnetic fields, tends to move rapidly and semi-randomly around the target surface, leaving a trail of microscopic crater-like features on the target surface. Although the small-scale motion of the arc is a semi-random jumping from crater site to crater site, the electromagnetic force due to the interaction between the current in the arc jet and any magnetic field present at the cathode surface has a dominant influence on the large-scale average movement of the arc spot. An externally applied magnetic field causes a force on the arc jet in a direction perpendicular to both the field lines and the jet. In the absence of an applied magnetic field, the interaction of the current in the arc jet with the self-magnetic field caused by the arc current flowing through the cathode can tend to draw the arc spot toward the current input, if the current flow through the cathode is asymmetrical. The direction of the motion of the arc in a magnetic field is opposite or retrograde to the vector J×B direction expected based on Ampere's law, considering the current to be in the same direction as in the external circuit.

An undesirable side effect of the vaporization of the target material at the arc spot is the generation of droplets of molten target material, which are ejected from the target by the reaction forces due to expansion of the vapor jet. These droplets are called macro-particles, and range in diameter from sub-microns to tens of microns. The macro-particles become imbedded in the coating when they land on the substrate, forming objectionable irregularities. Various strategies have been devised to reduce the generation of macro-particles or to prevent their arrival at the substrate. The problem of macro-particles is particularly acute at the point of arc initiation at the start of the helical trajectory, and also at the terminus of the helical trajectory where the arc extinguishes.

U.S. Pat. No. 2,972,695 describes magnetic stabilization of a vacuum arc used for evaporation deposition including a coaxial deposition geometry. U.S. Pat. No. 3,625,848 describes an arc evaporation apparatus with certain electrode configurations and also teaches the use of a magnetic field to increase the evaporation rate and to direct ions to the substrate. U.S. Pat. No. 3,783,231 describes the use of a magnetic field activated when the arc spot moves off the desired evaporation surface of the cathode. U.S. Pat. Nos. 4,724,058 and 4,849,088 each describe an arc evaporation apparatus using a magnetic field in the shape of a closed loop tunnel, which confines the arc spot to a closed loop circular trajectory at a fixed location on the cathode surface. In order to uniformly erode the entire target surface, it is necessary to move the magnetic field generating means to move the arc trajectory over the target surface, either by mechanical movement of the magnet means as described in U.S. Pat. Nos. 4,849,088, 5,908,602, and 5,306,408 or by use of multiple electromagnets, as described in U.S. Pat. No. 4,724,058.

U.S. Pat. No. 4,492,845 describes an arc evaporation apparatus using an annular cathode, in which the evaporable surface is the outer wall, facing a cylindrical anode of larger diameter and greater length than the cathode. The substrates to be coated are disposed inside the annular cathode, not facing the evaporable surface. A coaxial magnetic field is described for diverting charged particles of evaporated material away from the anode and back toward the substrate to be coated.

U.S. Pat. No. 4,609,564 describes a coaxial deposition system without the use of an external magnetic field, and includes cathode temperature control. The problem of tapered material deposition is also discussed.

U.S. Pat. No. 4,857,489 discloses a coaxial coating system for bottles. This system includes a cathode, an anode comprising the object to be coated, a heating source for the anode, an evacuation system, and a source of nitrogen gas.

U.S. Pat. No. 5,037,522 describes the use of a cathode in the form of a long cylinder or rod, which makes use of the self-magnetic field of the arc current to force motion of the arc along the length of the cathode. The direction of the arc's travel on the cathode may be reversed by switching the power supply connection from one end of the cathode to the other.

U.S. Pat. No. 5,269,898 describes a system for an arc evaporation coating chamber where an arc between a coaxial inner cathode and outer anode traverses a helical path which may be altered by either feeding the cathode with a balanced current from each end, or by applying a magnetic field coaxial to the anode and varying the current generating the magnet field, thereby varying the speed of helical movement of the arc down the cathode. The magnetic field generator is inside the evacuated chamber, disposed about the cathode, and with the anode outside the extent of the objects being coated.

U.S. Pat. No. 4,859,489 describes a system for coating a cylindrical bottle using a plasma arc in the presence of an inert gas. U.S. Pat. No. 5,037,522 describes a coaxial system of an anode and cathode, whereby the arc that is struck is used to make uniform coatings on the inner surface of a cylindrical tube placed between an anode and cathode. In both of these systems, the current drawn through the inner cathode is responsible for the creation of a magnetic field, which causes the arc to travel a helical trajectory along the inner conductor.

U.S. Pat. No. 5,354,963 describes a surface heat treatment using a plasma arc in the presence of an inert gas and a magnetic field for controlling the direction of the plasma.

U.S. Pat. No. 5,976,636 describes a plasma arc plating system including helical coils for the direction of the plasma towards the items to be plated.

While the prior art describes the use of either varying magnetic fields or changing the applied electric arc current to change of rate of deposition in a coaxial ion deposition system, it is desired to control the thickness of material deposited, and to control the composition of the material deposited along the axis of the object being coated. Additionally, it is desired to provide for a uniform coating thickness over the extent of the object, as well as at the point of arc initiation and arc termination.

OBJECTS OF THE INVENTION

A first object of the invention is an apparatus for the deposition of a variable thickness of a cathode material onto a cylindrical anode in the presence of a gas by varying the pressure of the gas.

A second object of the invention is an apparatus for the deposition of the reaction product formed by a plasma comprising ions released by a cathode reacting with a gas, said reaction products depositing onto a cylindrical anode, whereby the reaction stoichiometry is varied by changing the pressure of the gas.

A third object of the invention is a removable cap disposed on at least one end of the object to be coated whereby macroparticles and other non-uniformities associated with the start and end of the plasma arc are deposited on the removable caps rather than the object to be coated.

SUMMARY OF THE INVENTION

A cylindrical conductor 102, also referred to as an anode, having a central axis 106 is placed in a magnetic field 110 coaxial to this central axis 106. A cathode 104 is placed inside the anode 102, and the cathode 104 is positioned on or near the central axis 106 of the cylindrical anode 102, where the cathode 104 has an extent larger than the extent of the anode 102. A plasma arc is initiated between the central cathode 104 and the outer cylindrical conductor anode 102, and the direction of the plasma maintains a generally radial geometry from cathode 104 to anode 102. An external magnetic field 110 in combination with the movement of plasma ions causes an azumithal and axial Lorentz force, which causes the plasma to temporally follow a helical path 120, advancing in radial angle about the central axis 106 while advancing down the central axis 106. The ionic particles of the plasma are deposited on the anode 102 while the plasma advances down the central axis 106. When the plasma arc is initiated from a starting point 116, it travels this helical trajectory along the central axis 106 of the anode 102 to an end point 118. Over successive deposition cycles, the gas pressure of the chamber 124 is varied, causing the chemical composition of reaction product of the gas and the cathode material which is deposited on the anode to vary according to the gas pressure variation. By varying the gas pressure over many deposition cycles, the composition of the material deposition may be varied, thereby providing a linear gradation, or any other type of deposition profile desired.

DETAILED DESCRIPTION OF THE INVENTION

Figure 1:
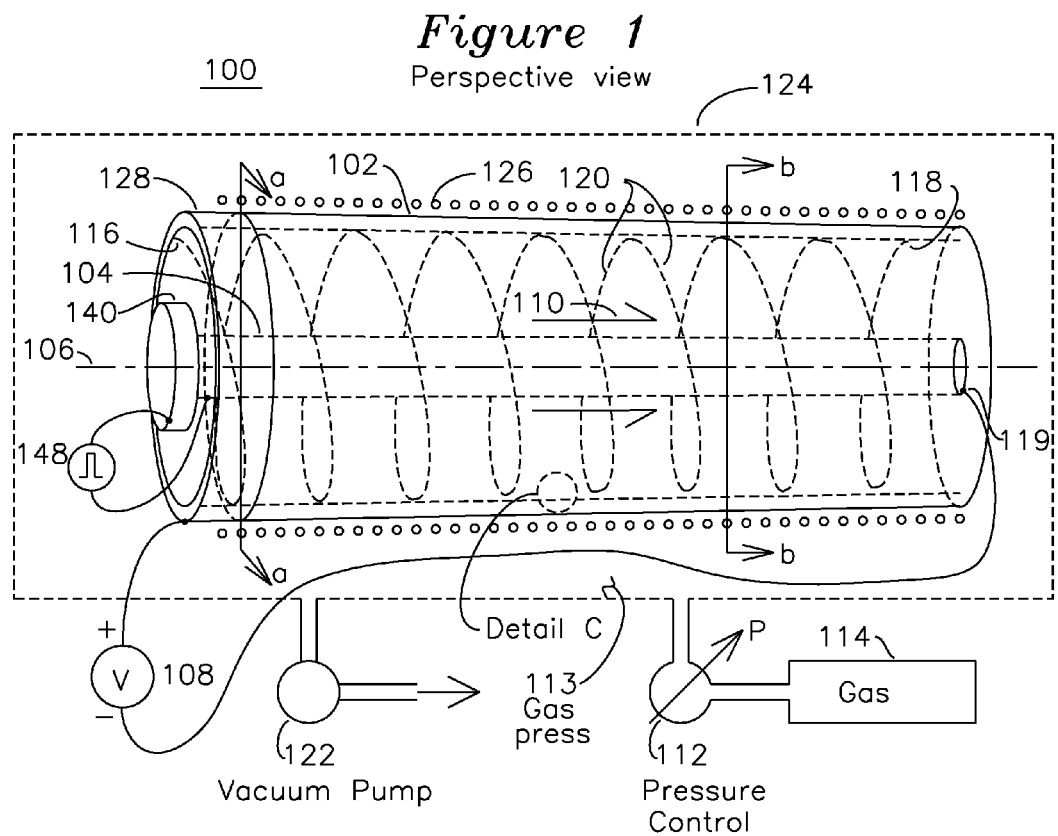
FIG. 1 shows a perspective view of a coaxial plasma arc deposition system.
Figure 1A:
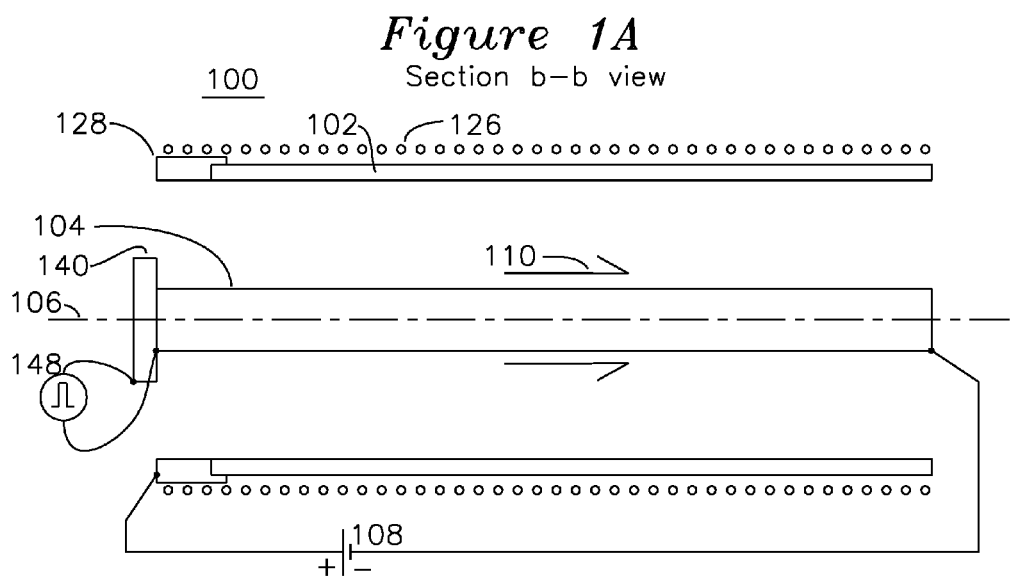
FIG. 1A is a cross section view of FIG. 1.

FIG. 1 shows a perspective view of a coaxial plasma arc deposition system 100, shown also in section b-b view as FIG. 1A, the plasma arc deposition system 100 comprising a chamber 124, a vacuum pump 122, a source of gas 114, a pressure control valve 112, and a cylindrical anode 102, which is to have an inner surface coated by material contributed by a cathode 104. Surrounding the anode 102 is a magnetic B field 110 generated by coil 126 which creates a magnetic field 110 parallel to the central axis 106. Placed substantially on the central axis 106 is the cathode 104, which is formed from the material to be deposited on the inside of the anode 102. A voltage source 108 is applied with a positive potential on the anode 102 and a negative potential on the cathode 104. A plasma arc initiator 140 initiates a plasma arc near a start point 116 on one end of the anode 102, and once initiated, the plasma follows a helical path 120 until it reaches end point 118 on the opposite end of the anode 102. The pitch and speed of the resulting helical arc path is governed by the strength of magnetic field 110 generated by magnetic field generator coil 126.

Figure 2:
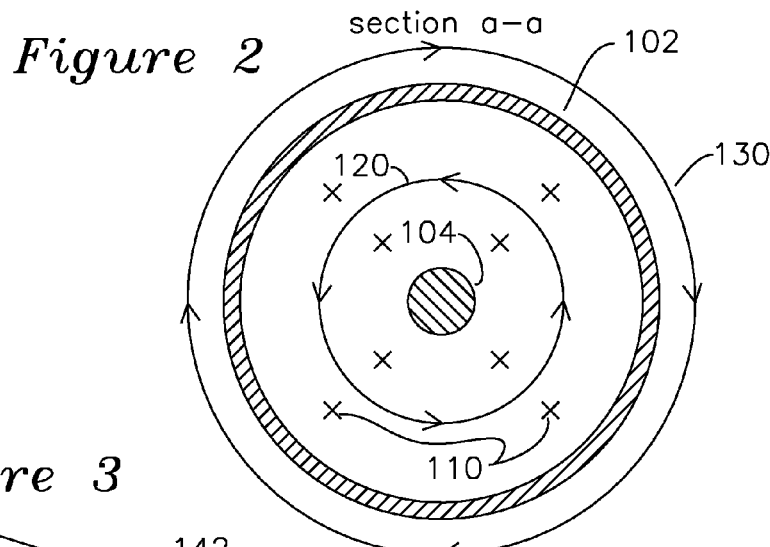
FIG. 2 shows a cross section view of the deposition system of FIG. 1.

FIG. 2 shows a cross section view a-a of FIG. 1, including the anode 102, cathode 104, and magnetic field 110, which may be generated by current 130 flowing in coil 126 of FIG. 1. The direction of helical path 120 tends to be opposite the direction expected from J×B electrostatics.

Figure 3:
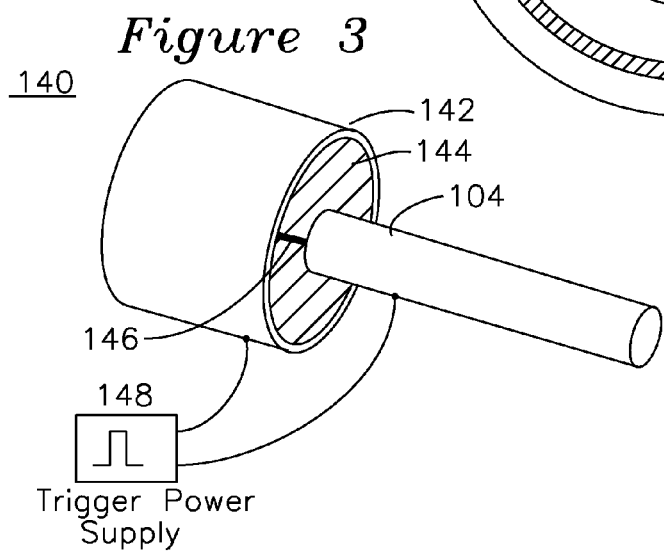
FIG. 3 shows the ignition starter for the plasma arc deposition system of FIG. 1.

FIG. 3 shows the plasma arc initiator 140 of FIG. 1. The plasma arc initiator 140 comprises a cylindrical electrode 142 separated from the cathode 104 by an insulating separator 144 that is coated on the front surface with a conducting material. The application of an instantaneous trigger voltage from trigger power supply 148 causes a localized plasma or initiation arc 146 which forms and spreads after removal of the trigger potential to anode 102 of FIG. 1. The plasma arc initiator 140 may take any form that involves the generation of an initiation arc 146 using a trigger voltage from trigger power supply 148 applied between the cathode 104 and initiation arc 146. The arc preferably forms on the surface of separator 144, which is an insulating material.

Figure 4:
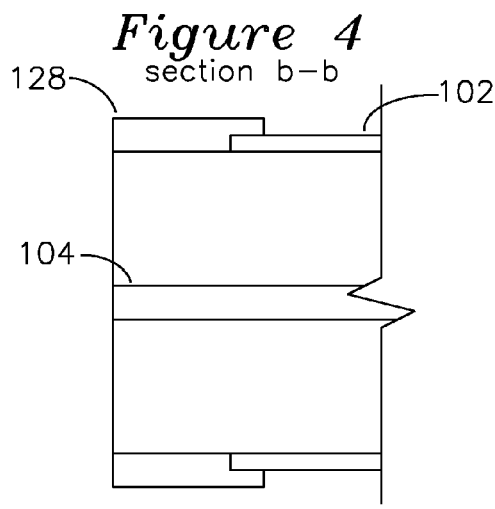
FIG. 4 shows a removable end cap for the deposition system of FIG. 1.

FIG. 4 shows the detail of an end cap 128, which may be applied to the plasma arc initiator 140 of FIG. 1 end of the anode 102, as shown, or to the electrode 119 end of the anode 102. When the plasma arc starts at the plasma arc initiator 140 of FIG. 1, the generated plasma tends to be non-uniform, and may include macro-particles, which are particles larger than desired, which deposit on the anode 102. These result in a non-uniform coating on the initiator end of the anode 102, and may also appear on the electrode 119 of FIG. 1 end of the anode 102. The end cap 128 represents a continuously conductive but removable part of the anode 102, such that the initiation and termination of the plasma arc does not result in non-uniform deposition or excessive macro-particle deposition on the anode 102, but instead these particles appear on the removable end cap 128 on the initiator end and on a removable end cap on the electrode end (not shown). The end caps may optionally be placed on the plasma arc initiator 140 end of anode 102, on the electrode 119 end of anode 102, or on both ends. The joints must have continuous conductivity, which may be achieved through the use of conductive gasket material (not shown) applied in the interface between end cap 128 and anode 102.

Figure 5:
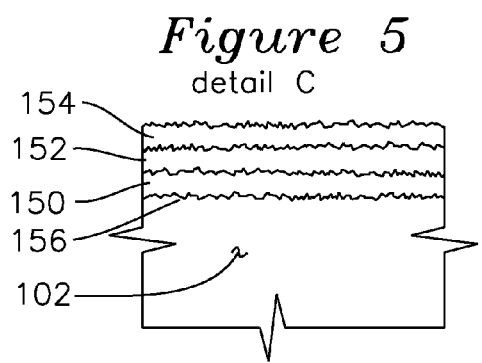
FIG. 5 shows a detail cross-section view of the cylindrical anode having several successive depositions.

FIG. 5 shows a magnified cross section view of the inner surface of anode 102, noted as detail C of FIG. 1. The results of a first plasma arc deposition are shown as initial deposition 150, and subsequent depositions 152 and 154 are shown above this. There may be any number of successive depositions, and the deposition material composition of each deposition layer 150, 152, 154 may be varied by changing the gas pressure 113 of FIG. 1 during each deposition cycle. For example, initial deposition 150 could be formed when the cathode 104 is a tantalum (Ta) electrode and the anode 102 is steel, and the gas is methane (CH4), forming TaC under the reaction $Ta + CH_4 \leftrightarrows TaC + 2H_2$. In this example, a starting pressure of 100 mTorr would generate an initial deposition 150 of 100% TaC and 0% Ta, with the gas pressure tapering to 10-5 mTorr, where the deposition 154 would be 0% TaC and 100% Ta. By tapering the pressure of the gas over successive deposition events, it is possible to generate coatings with gradation of composition from the surface deposition 154 to the underlying base material of anode 102. There are typically many deposition coatings applied, although 3 deposition coatings are shown for clarity.

The cathode 104 may contain at least one of the following materials: Chromium (Cr), Molybdenum (Mo), Niobium (Nb), Rhenium (Re), Tantalum (Ta), Titanium (Ti), or Tungsten (W), which produces a deposition product of the same material in the absence of a gas which reacts with the cathode material in plasma. Where a reactive gas is present, the reaction product formed by the cathode 104 and the introduced gas in a plasma may be any of the products of reaction: TaN, TaC, TiN, CrN, $Al_2O_3$, or $W_2C$. These are given as examples only, and are not intended to limit the invention to these cathode materials or reaction products. Further, it is clear that many different gasses may be introduced which form these reaction products, including Nitrogen, Oxygen, Methane, and many others.

Figure 6:
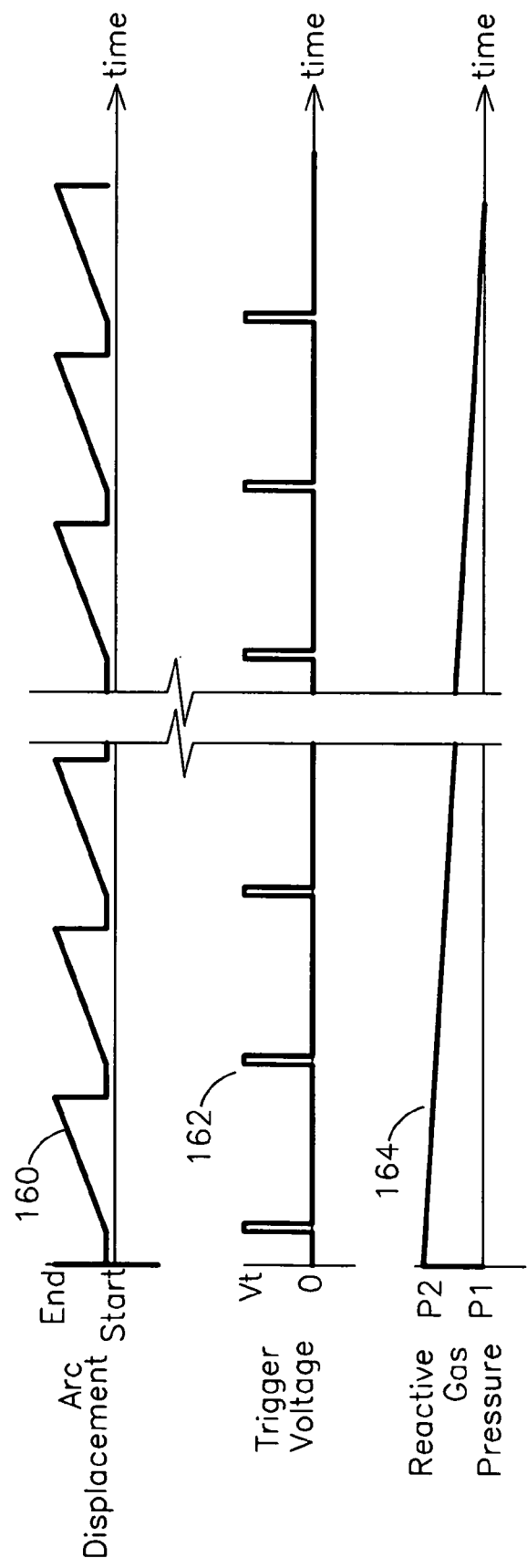
FIG. 6 shows the time progression of a succession of deposition cycles in the presence of varying gas pressure.

FIG. 6 shows the operation of the deposition apparatus over multiple coatings. Arc displacement curve 160 indicates the successive application of the plasma arc from a start location, which is typically at the plasma arc initiator 140 end of the anode 102, to an end location that is typically at the electrode 119 end of the anode 102, both shown on FIG. 1. Trigger voltage waveform 162 shows the instantaneous application of the trigger voltage from trigger power supply 148 of FIGS. 1 and 3, which initiates the traveling plasma arc shown on waveform 160. As each successive arc deposition event occurs as shown in waveform 160, the gas pressure is varied from a start pressure P2 of curve 164 to an end pressure P1 of curve 164. This pressure may be increasing or decreasing, or vary in any manner for which the pressure results in reactive coatings suitable for each deposition event, as is discussed in detail below.

The plasma may form with only the gas 114 of FIG. 1 ionizing, or it may include reaction components of the gas 114 with the cathode 104. By selecting a reactive combination of the cathode material 104 and gas 114, it is possible to generate ionic particles with desired coating properties, as will be discussed later. As the plasma follows the helical path 120, particles comprising reactive products from the high current densities of cathodic spots are deposited on the inside surface of the anode 102. These particles are driven towards the anode 102, which is positive with respect to these particles, and the ionic particles of the plasma are attracted to the anode 102, and form a deposition layer on the inner surface of the cylindrical anode in the region of the plasma. Because the ionic particles impinge on this surface at high velocity, they mechanically key into and deposit onto the inner wall of the anode 102. The density of these ionic particles is controllable by the pressure of the gas 114. By varying the pressure of the gas 114 in the chamber 124 using pressure control valve 112, it is possible to vary the rate of deposition on the inner surface of anode 102.

A plasma arc is struck between the cathode and the anode using a trigger-less arc system. During the arc discharge event, the discharge current is localized in an area known as a cathode spot, which is of extremely high current density ($\sim 10^{12}$ A/m$^2$). This current density is associated with a correspondingly high areal power density ($10^{13}$ W/m$^2$) which provides the energy for a localized phase transformation from the solid to a fully ionized plasma. The characteristic time and dimension of cathode spots are in the sub-microsecond and micrometer range, respectively.

The plasma generated at the cathode spots rapidly expands into the ambient vacuum. In general, cathodic arc plasmas contain multiply ionized species. The ion charge state distributions for over 50 elements have been measured at Lawrence Berkeley National Laboratory and are presented in the form of a periodic table of material and plasma properties by Anders in IEEE Transactions on Plasma Science, Vol. 29, No. 2, April, 2001, 393-398. Notably, due to ion-electron coupling within the plasma, the final ion velocities fall within the range $1-3 \times 10^4$ m/s, seemingly independent of species and ion charge state. These directed velocities correspond to kinetic energies of approximately 20 eV or greater for low-Z elements and 200 eV for the high-Z elements. Furthermore, since the plasma is fully ionized, the kinetic energy of the ions may be controlled by adjusting the voltage drop across the cathode and anode. These high-energy ions are the most important reason for the improved film properties obtained by cathodic arc plasma deposition. Conventional evaporation and sputtering systems produce ion energies that are at least an order of magnitude lower than those of arc discharges. The higher deposition energy of the Coaxial Energy Deposition (CED) process tends to produce films that are denser and have better adhesion characteristics. The better adhesion of CED coatings is due to interface mixing, produced by the higher energy ions. Transmission Electron Microscope (TEM) images of the interface between a silicon substrate and a carbon coating deposited using a CED system show that the C atoms have penetrated several atomic diameters into the silicon, interlocking the two layers.

Figure 7:
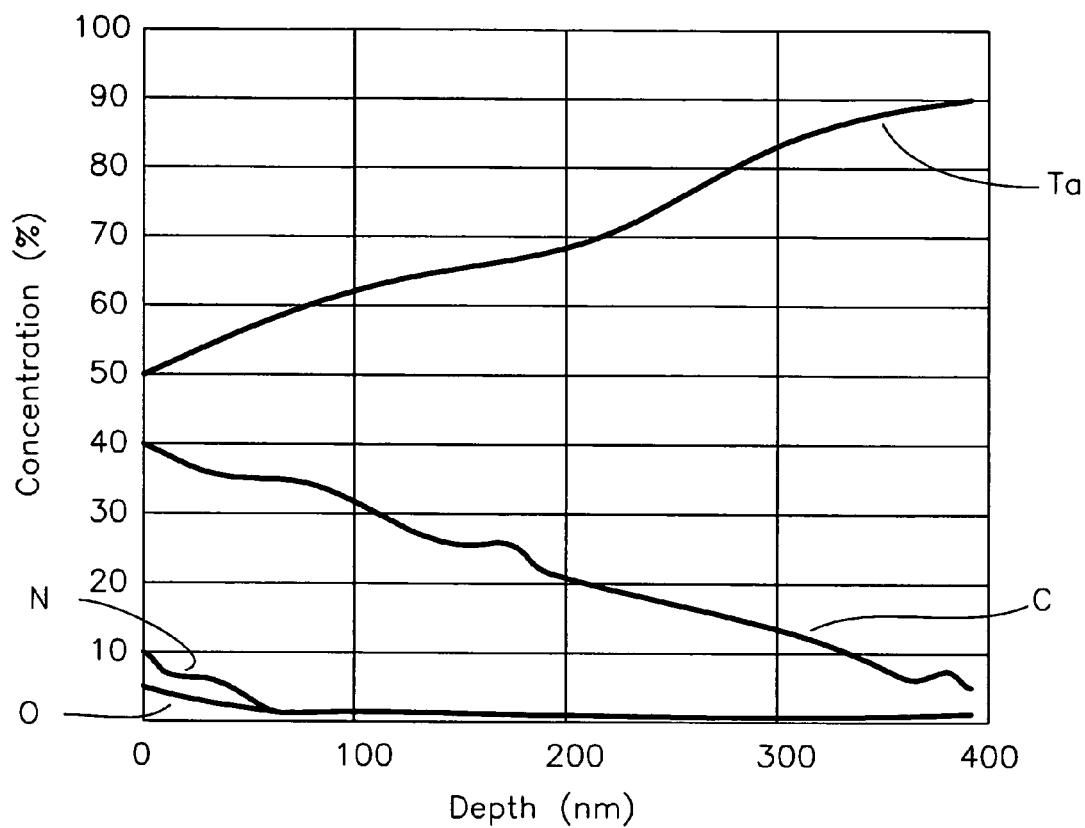
FIG. 7 shows the relative concentrations of Ta and C with depth in a ceramic layer formed using a Ta cathode and CH4 reactive gas.

Ceramics can be deposited in the CED process by introducing background gasses into the vacuum chamber. To deposit TaC, for instance, a Ta cathode is used while $CH_4$ flows into the chamber. The stoichiometry of the film is controlled by the partial pressure of the background gas. Tests have shown that to produce stoichiometrically correct 1:1 TaC requires a $CH_4$ partial pressure of about 100 mTorr. Reducing the gas pressure yields a film with a higher Ta to C ratio, where in the extreme, if no gas is introduced, pure Ta is deposited. This point is illustrated in FIG. 7, which is derived from Rubinshtein, A., Shneck, R., Raveh, A., Klemberg-Sapieha, J., Martinu, L., J. Vac. Sci. Technol. A 18 (4) July/August (2000). FIG. 7 shows the relative concentrations of Ta and C in a ceramic layer produced using a plasma deposition system with $CH_4$ as the reactive gas. Note that at the surface, the stoichiometry of the film is almost 1:1, and that it changes nearly linearly to pure Ta with depth. The pressure control may be achieved many ways, including a precision needle valve or a mass flow valve, both of which may be controlled by a computer so the gas pressure and stoichiometry of the film can be precisely regulated as the film grows.

The control process for producing a linearly-graded coating may require using a mass flow valve (MFV) so that a computer can accurately control the background gas pressure as the process proceeds. While it may seem that the MFV should open linearly as the film grows to produce a linearly-graded coating, due to non-linear reaction dynamics, and due to the complex interaction between pumping-speed and pressure in vacuum systems, the required flow-rate will not likely be linear with film thickness and will need to be determined empirically.

An additional application for the CED process is to coat the inside surfaces of rocket nozzles. The CED process is ideal for applying high-temperature ceramics and metals to these cylindrically symmetric structures that vary in diameter along their length.

Another application is in the application of coatings to gun barrels. To increase their range and lethality, modern guns use new projectile designs with higher energy and temperature propellants that produce higher chamber pressures and gun-wall temperatures. These increasingly severe conditions lead to enhanced thermochemical erosion rates that limit the service life of present gun systems and may preclude the implementation of future more advanced designs. Some of the deleterious effects of these higher temperatures and pressures include increased reaction and diffusion rates, which enhance the formation of iron oxides, sulfides and carbonized iron. These materials have lower melting points and weaker mechanical properties than steel and thus are more easily removed, rapidly eroding the gun barrel surface. In addition, the higher temperatures can lead to direct melting of the gun steel, to metallurgical phase transitions, and to thermal and transformational stresses, which conspire to erode the barrel surface at unacceptably high rates. To be effective, these coatings must have excellent adhesion and cohesion, form good chemical and thermal barriers, and exhibit good mechanical properties. At present, the most common coating is electrodeposited chromium (Cr), either low-contractile (LC) Cr or high-contractile (HC) Cr. LC Cr is more desirable than HC Cr because fewer micro-cracks are formed during the deposition process. There are several drawbacks to Cr coatings. For one, the micro-cracks that are formed during the plating process, and additional cracks that form during the use of the gun, allow hot reactive gases to reach the underlying steel, producing erosion pits that undermine the Cr layer. For another, since Cr is deposited using electroplating, it is too thin to serve as an effective thermal barrier. Hence, it does not damp-out the thermal pulse generated by firing the gun, which leads to phase transitions and enhanced chemical transformations in the steel. These transformations promote cracking of the chromium and coating failure. If the chromium is plated thicker, the inherent tensile stresses and the low adhesive strength cause the coating to spall off. Finally, chromium's melting point is not as high as those of ceramic coatings or refractory metals such as tungsten. Other gun barrel coatings have been investigated, with refractor metals and ceramics being the most common. The advantage of ceramics is that they have extremely high melting points, excellent chemical resistance and are very hard. For example, tantalum carbide (TaC) has a melting point of about 3900° C. (7050° F.), over twice that of 4330-gun steel, and a Rockwell A hardness of 88, about 26% harder than gun steel. In addition, TaC is stable in strongly oxidizing environments, even at temperatures in excess of 800° C. (1470° F.).

The drawback of ceramic coatings in harsh environments has been poor adhesion at the metal interface and poor thermal and mechanical shock resistance. By using a linearly-graded ceramic-metal coating which is available through the variation of gas pressure during the coating process, as described in the present invention, these mechanical properties will improve. For example, the coating will have better adhesion since a pure metal, such as tantalum (Ta), is in contact with the steel barrel rather than with the ceramic. The cohesion of the film is very good, since it transitions smoothly through a mixed ceramic-metal matrix, and therefore, there is no preferential interface to initiate delamination. The smooth transition also improves the shock resistance of the coating, as the ceramic-metal matrix should be more ductile than the pure ceramic.

The Coaxial Energy Deposition process may be used to deposit ceramic films on the inside of ethylene cracking tubes that are used in olefin manufacturing. These cracking tubes are subjected to extreme conditions, similar in many respects to those conditions found in gun barrels. For example, the ethylene cracking tubes run at temperatures in excess of 1100 C. Hot, corrosive gases, containing hydrocarbon, sulfur and nitrogen compounds, flow through the tubes at high velocity. Many of the same corrosive effects and metallurgical phase transitions that are observed in gun barrels are also observed in these tubes.

There are many advantages to the CED process for coating the inside of tubes. The absence of moving parts makes the process relatively inexpensive to implement—all that is needed is a vacuum chamber and two power supplies. The CED process can be used to coat tubes of almost any length and of a wide range of diameters. The process is also efficient, producing minimal heating of the substrate and vacuum chamber, in contrast with the prior art approaches, many of which require water cooling of the components.

Another major advantage of the CED process is that the deposition ions are more energetic than the ions produced in CVD, electroplating or sputtering systems. Hence, CED films tend to have better adhesion, higher densities, and fewer cracks and voids than films produced using these other methods. The better adhesion characteristics of CED films is a result of surface intermixing due to the impact of the energetic ions. In addition, films deposited using the CED process tend to be under compressive stress, which also promotes good adhesion and cohesion.

We claim:

1. An apparatus for the deposition of an evaporated material from the outer surface of a cathode onto a cylindrical inner surface of an anode using a plasma, said apparatus comprising:

an enclosed chamber including a vacuum pump and a variable pressure gas source;

said cathode formed from a first conductive material and placed on an axis;

said cylindrical anode formed from a second conductive material, said cylindrical anode placed at a positive electrical potential with respect to said cathode, said cylindrical anode having at least one removable conductive cap attached to a plasma initiation end of said cylindrical anode or to both ends of said cylindrical anode, said cylindrical anode having a constant inner diameter over an extent of said cylindrical anode which includes said at least one removable conductive cap, said removable conductive cap fitting onto the constant inner diameter of said cylindrical anode and electrically connected to said cylindrical anode;

a magnetic field generator located external to said cylindrical anode, said magnetic field generator providing a temporally constant magnetic field oriented substantially parallel to said axis, said magnetic field being unidirectional over a radial extent from said cathode to said anode;

a voltage source delivering a positive voltage to said cylindrical anode and a negative voltage to said cathode, thereby creating and maintaining said plasma;

whereby said plasma has a plasma current which flows between said cathode and said anode and said magnetic field generator produces a magnetic field sufficient to cause said plasma to move helically down said axis at a speed controllable by the strength of said magnetic field such that said evaporated material is deposited on and contained by said inner surface of said anode;

and where at least one said removable conductive cap is located in a region of said anode where macro-particles of initiation or termination of said plasma may form.

2. The apparatus of claim 1 where said variable pressure gas source includes a valve which couples said gas source to said enclosed chamber following the evacuation of said chamber by said vacuum pump.

3. The apparatus of claim 2 where said variable pressure gas source is a variable pressure source of nitrogen.

4. The apparatus of claim 1 where said cathode includes at least one of the elements Chromium (Cr), Molybdenum (Mo), Niobium (Nb), Rhenium (Re), Tantalum (Ta), Titanium (Ti), or Tungsten (W).

5. The apparatus of claim 1 where said cathode includes a plasma initiator having an initiation surface coated with a conducting material.

6. The apparatus of claim 5 where said plasma initiator includes a trigger power supply delivering a pulsed voltage of sufficient amplitude to cause an area of arcing from said cathode.

7. The apparatus of claim 5 where said plasma initiator comprises a trigger power supply delivering a high voltage spark between said cathode and a cylindrical conductor separated from said cathode by an insulating material, said high voltage spark having an amplitude sufficient to cause arcing from said cathode to said stationary cylindrical conductor.

8. The apparatus of claim 5 where said plasma initiator includes a trigger power supply delivering a voltage between said cathode and a cylindrical conductor separated from said cathode by a conductive material located on said planar initiation surface between said cathode and said cylindrical conductor.

9. The apparatus of claim 7 where said surface resistive material has a resistance greater than 50 ohms.

10. The apparatus of claim 1 where said deposition is the reaction product from said gas and said cathode.

11. The apparatus of claim 10 where said reaction product is at least one of TaN, TaC, TiN, CrN, $Al_2O_3$, $W_2C$, Cr, Mo, Nb, Re, Ta, Ti, W.

12. The apparatus of claim 1 where said cathode is a solid rod.

13. The apparatus of claim 1 where said cathode is a hollow cylinder.

14. The apparatus of claim 13 where said hollow cylinder includes provision for a coolant.

15. The apparatus of claim 1 where said gas pressure is varied during a deposition cycle to provide a deposition thickness which varies along said axis extent.

16. A process for the deposition of an evaporated material from the outer surface of a cathode onto the inner surface of a cylindrical anode using a plasma, said process comprising the steps:

a first step of placing inside an enclosed chamber including a vacuum pump and a variable pressure gas source:

said cathode formed from a first conductive material and placed on an axis;

said cylindrical anode formed from a second conductive material, said cylindrical anode placed at a positive electrical potential with respect to said cathode, said cylindrical anode including at least one removable end cap for deposition of plasma macroparticles, said cylindrical anode having a constant inner diameter over an extent of said cylindrical anode which includes said removable end cap attached to one end of said cylindrical anode or to both ends of said cylindrical anode, said end caps fitting onto part of the constant inner diameter of said cylindrical anode and electrically connected to said cylindrical anode;

a magnetic field generator located external to said cylindrical anode, said magnetic field generator providing a temporally constant magnetic field oriented substantially parallel to said axis, said magnetic field being unidirectional over a radial extent from said cathode to said anode;

a voltage source delivering a voltage applied between said cylindrical anode and said cathode;

a second step of initiating a plasma arc from a first end of said cathode, said plasma arc forming a plasma having a plasma current, said plasma forming between said cathode outer surface and said cylindrical anode inner surface, said plasma interacting with said magnetic field to generate a substantially helical rotation of said plasma about said central axis and thereby depositing ions from said cathode onto the inner surface of said anode;

a third step of changing said gas pressure during a repetition of said second step;

a fourth step, after completion of said second step and said third step, of removing said at least one end cap having said macroparticles.

17. The process of claim 16 whereby said third step gas pressure is increased during said repetition of said second step from an initial value to a final value.

18. The process of claim 16 whereby said third step gas pressure is decreased during said repetition of said second step from an initial value to a final value.

19. The process of claim 16 where said first step gas source contains at least one of nitrogen, oxygen or methane.

20. The process of claim 16 where said cathode includes at least one of the elements Chromium (Cr), Molybdenum (Mo), Niobium (Nb), Rhenium (Re), Tantalum (Ta), Titanium (Ti), or Tungsten (W).

21. The process of claim 16 further including the use of chromium as said cathode, thereby producing said cylindrical anode suitable for use as a gun barrel.

22. The process of claim 16 further including the use of Aluminum as said cathode and oxygen as said gas, thereby producing said cylindrical anode suitable for use as an olefin pipe.

* * * * *